United States Patent [19]
Lin et al.

[11] Patent Number: 6,105,244
[45] Date of Patent: Aug. 22, 2000

[54] PROCESS FOR MANUFACTURING MEMORY CARD AND ADAPTER THEREOF

[75] Inventors: Samuel I-En Lin, Miao-Li Hsien; Jyh-Cherng Yang, Hsinchu, both of Taiwan

[73] Assignee: Uconn Technology Inc., Taiwan

[21] Appl. No.: 08/965,533

[22] Filed: Nov. 6, 1997

[51] Int. Cl.[7] ................................................. H05K 3/30
[52] U.S. Cl. ........................... 29/841; 29/832; 174/52.3
[58] Field of Search ........................ 29/832, 840, 841; 174/52.2, 52.3

[56] References Cited

U.S. PATENT DOCUMENTS

| | | | |
|---|---|---|---|
| 3,615,946 | 10/1971 | Palmer | 156/3 |
| 4,974,317 | 12/1990 | Rodriguez, II et al. | 29/841 |
| 5,454,157 | 10/1995 | Ananth et al. | 29/603 |
| 5,475,919 | 12/1995 | Wu et al. | 29/841 |
| 5,502,892 | 4/1996 | Lien | 29/841 |
| 5,510,959 | 4/1996 | Derstine et al. | 361/816 |
| 5,704,117 | 1/1998 | Mok et al. | 29/841 |
| 5,831,825 | 11/1998 | Fromont | 361/719 |

*Primary Examiner*—Carl J. Arbes
*Assistant Examiner*—Kevin G. Vereene
*Attorney, Agent, or Firm*—Michael D. Bednarek; Shawpittman

[57] ABSTRACT

A process for manufacturing a memory card and the adapter thereof, each of which has a first cover, a second cover, a frame and a PC board. The process includes the steps of forming the frame on the second cover by using the Insert Molding Method; disposing the PC board on the second cover with the PC board held by the frame; and gluing the first cover to the frame by using thermal-bonding film.

5 Claims, 4 Drawing Sheets

PROCESS FOR MANUFACTURING MEMORY CARD AND ADAPTER THEREOF

BACKGROUND OF THE INVENTION

1. Field of the Invention

The present invention relates in general to a process for manufacturing memory cards and the adapters thereof.

2. Description of the Related Art

Memory cards have been greatly developed in recent years. U.S. Pat. No. 5,475,919 discloses a memory card, which comprises a top cover, a bottom cover, a first frame, a second frame and a PC board. The first and second frames are respectively formed on the top and bottom covers by using the Insert Molding Method. Then, the first and second frames are bonded together by ultra sonic welding, with the PC board sandwiched between the top and bottom covers. U.S. Pat. No. 5,510,959 discloses another memory card, in which the first and second frames are engaged with each other.

The PC board may be damaged during the process of manufacturing the memory card. Then, it is necessary to detach the PC card from the memory card for repair. However, a problem arises because the first and second frames are firmly connected together. Furthermore, the adapter of the memory card encounters the same problem.

SUMMARY OF THE INVENTION

An object of the present invention is to provide a process for manufacturing a memory card and the adapter thereof that solves the above-mentioned problem.

In accordance with the object of the present invention, a process for manufacturing a memory card and the adapter thereof is provided. The memory card (or the adapter) has a first cover, a second cover, a frame and a PC board. The process comprises the steps of forming the frame on the second cover by using the Insert Molding Method; disposing the PC board on the second cover with the PC board held by the frame; and gluing the first cover to the frame by using thermal-bonding film.

In this invention, the first cover and the frame are glued by using industrial thermal-bonding film, which, at room temperature, is not sticky. However, it will become sticky when it is heated. Therefore the thermal-bonding film is heated. The upper cover 11 and the frame 13 can be firmly glued together when the thermal-bonding film cools. If the PC board fails in later quality tests, then the first cover is heated to separate from the frame. The PC board can be removed for proper repair.

BRIEF DESCRIPTION OF THE DRAWINGS

The present invention can be more fully understood by reading the subsequent detailed description and examples with references made to the accompanying drawings, wherein.

DETAILED DESCRIPTION OF THE PREFERRED EMBODIMENT

Figure 1:
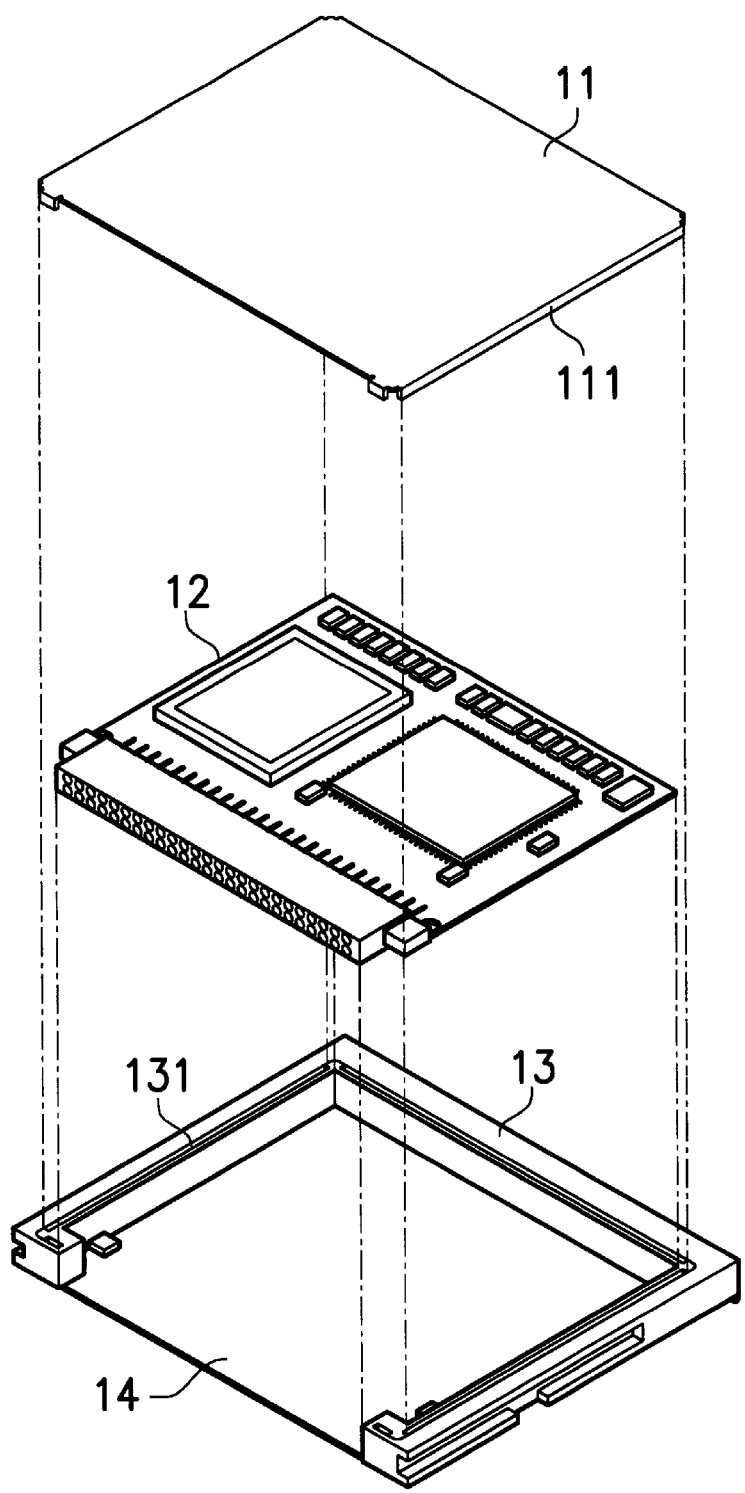
FIG. 1 is a perspective exploded diagram of a memory card, manufactured by using a process according to this invention.

Referring to FIG. 1, a memory card includes an upper cover 11, a PC board 12, a frame 13 and a lower cover 14. A process for manufacturing the memory card according to this invention is described as follows:

(Step 1) The lower cover 14 is inserted into a mold, and then melted plastic material is injected into the mold to form the frame 13 on the lower cover 14 (called the Insert Molding Method).

(Step 2) The PC board 12 is disposed on the lower cover 14 and is held by the frame 13.

(Step 3) The upper cover 11 is glued to the frame 13.

Figure 2:
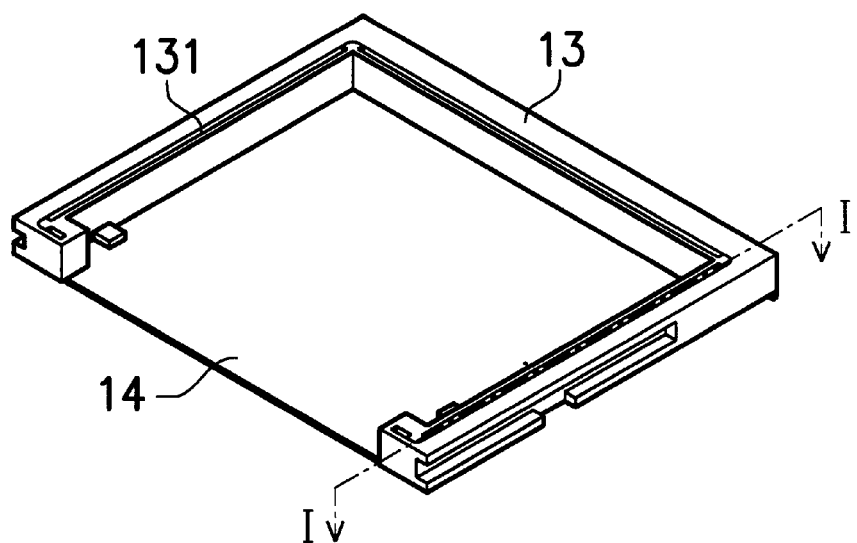
FIG. 2 is a partial perspective diagram of the memory card according to FIG. 1.
Figure 3:
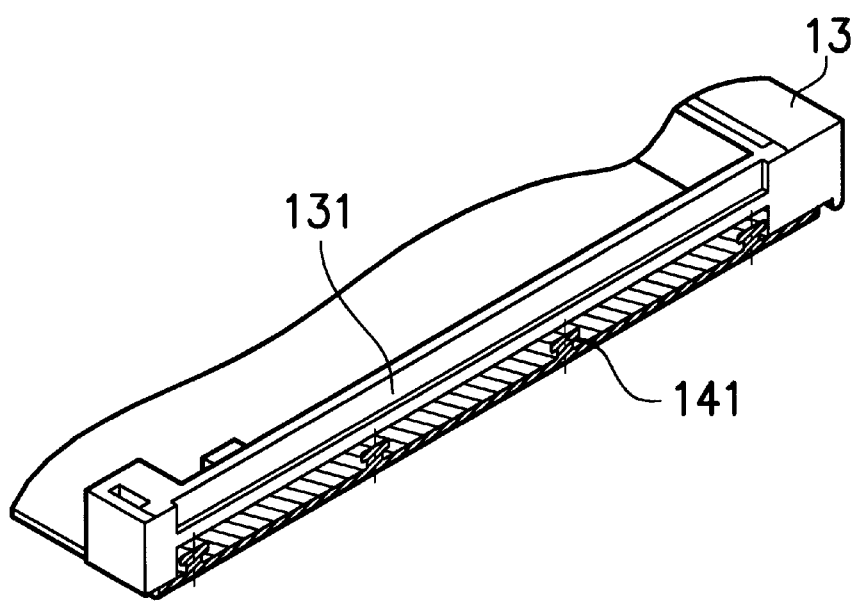
FIG. 3 is a partial sectional view along I—I according to FIG. 2.

Referring to FIGS. 2 and 3, it is noted that a plurality of T-shaped engaging portions 141, provided at the edges of the lower cover 14, are contained in the frame 13. This can prevent the frame 13 and lower cover 14 from separating.

It is also noted that the frame 13 has grooves 131 and the upper cover 11 correspondingly has bent edges 111. In Step 3, adhesives are applied to the grooves 131 of the frame 13. Then, the bent edges 111 of the upper cover 11 are inserted into the grooves 131. In this invention, the adhesive used to glue the frame 13 and the upper cover 11 together is industrial thermal-bonding film. Such kind of adhesive, at room temperature, is not sticky. However, it will become sticky when it is heated. In Step 3, therefore, the thermal-bonding film is heated. The upper cover 11 and the frame 13 can be firmly glued together when the thermal-bonding film cools.

Alternatively, the thermal-bonding film is applied to the upper cover 11 rather than the grooves 131 of the frame 13. The upper cover 11 and the frame 13 can also be glued together.

Figure 4:
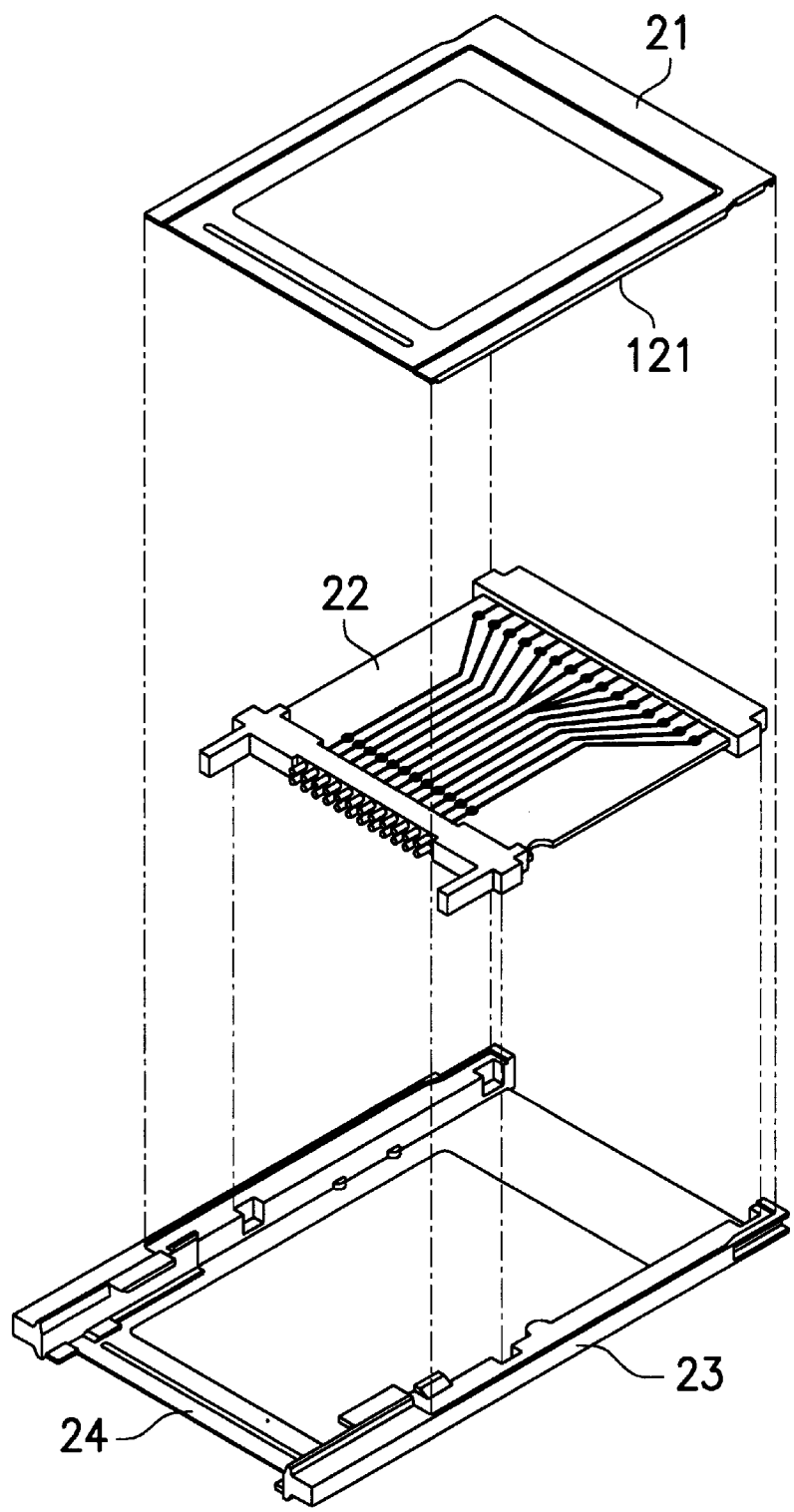
FIG. 4 is a perspective exploded diagram of an adapter that is manufactured by using a process according to this invention.

Referring to FIG. 4, an adapter of a memory card includes an upper cover 21, a PC board 22, a frame 23 and a lower cover 24. A process for manufacturing the adapter according to this invention is described as follows:

(Step A) The lower cover 24 is inserted into a mold, and then melted plastic material is injected into the mold to form the frame 23 on the lower cover 24.

(Step B) The PC board 22 is disposed on lower cover 24 and is held by the frame 23.

(Step C) The upper cover 21 is glued to the frame 23.

Figure 5:
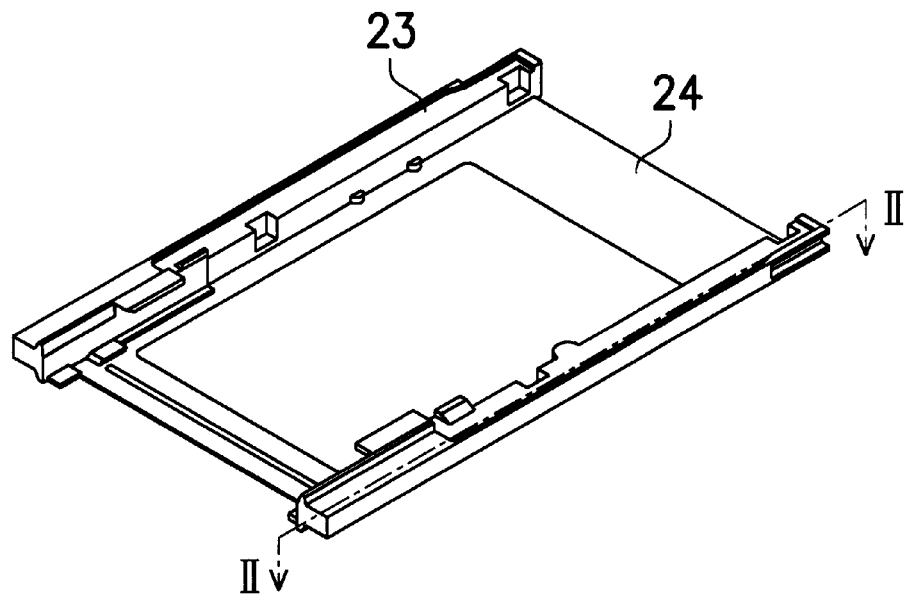
FIG. 5 is a partial perspective diagram of the adapter according to FIG. 4.
Figure 6:
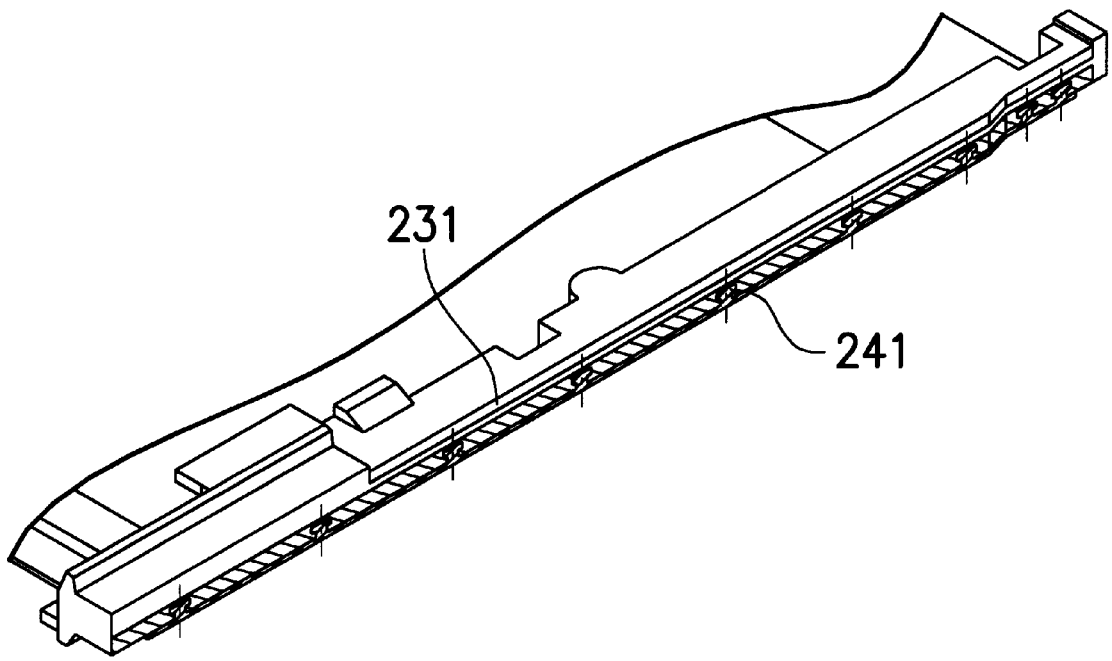
FIG. 6 is a partial sectional view along II—II according to FIG. 5.

Referring to FIGS. 5 and 6, it is noted that a plurality of T-shaped engaging portions 241, provided at the edges of the lower cover 24, are contained in the frame 23. This can prevent the frame 23 and lower cover 24 from separating.

It is also noted that the frame 23 has grooves 231 and the upper cover 21 correspondingly has bent edges 211. In Step C, thermal-bonding film is applied to the grooves 231 of the frame 23, and the bent edges 111 of the upper cover 11 are inserted into the grooves 131. Then the thermal-bonding film is heated. The upper cover 21 and the frame 23 can be firmly glued together when the thermal-bonding film cools.

Alternatively, the thermal-bonding film is applied to the upper cover 21 rather than the grooves 231 of the frame 23, to glue the upper cover 21 and the frame 23 together.

In this invention, the frame and the lower cover are connected as one piece by using the Insert Molding Method.

This reduces the number of components and facilitates component storage and transport. Furthermore, the upper cover and the frame are glued by using industrial thermal-bonding film. If the PC board fails in quality tests, then the upper cover can be heated to separate from the frame. Then the PC board can be removed for proper repair.

While the invention has been described by way of example and in terms of preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A process for manufacturing a memory card and an adapter thereof, each of which has a first cover, a second cover, a frame and a PC board, the process comprising the following steps:
   (1) forming the frame on the second cover by using the Insert Molding Method;
   (2) disposing the PC board on the second cover with the PC board held by the frame; and
   (3) gluing the first cover to the frame by using thermal-bonding film.

2. A process as claimed in claim 1, wherein the second cover has a plurality of T-shaped engaging portions at its edges, and the step (1) comprises forming the frame to contain the T-shaped engaging portions.

3. A process as claimed in claim 1, wherein the first cover has bent edges while the frame correspondingly has grooves, and the step (3) comprises applying the thermal-bonding film to the grooves, and then inserting the bent edges into the grooves to glue the first cover and the frame together.

4. A process as claimed in claim 1, wherein the step (3) comprises applying the thermal-bonding film to the first cover so as to glue the first cover and the frame together.

5. A process for manufacturing a memory card and an adapter thereof, the process comprising the steps:
   (1) forming a first cover;
   (2) forming a second cover having a plurality of T-shaped engaging portions at its edges;
   (3) forming a frame having a plurality of T-shaped engaging portions on the second cover by using the Insert Molding Method;
   (4) disposing a PC board on the second cover with the PC board held by the frame; and
   (5) gluing the first cover to the frame by using thermal-bonding film.

* * * * *